(12) United States Patent
Armitage et al.

(10) Patent No.: US 11,923,402 B2
(45) Date of Patent: Mar. 5, 2024

(54) LIGHT EMITTING DIODE DEVICE

(71) Applicant: Lumileds LLC, San Jose, CA (US)

(72) Inventors: Robert Armitage, Cupertino, CA (US); Isaac Wildeson, Nashua, NH (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/159,331

(22) Filed: Jan. 25, 2023

(65) Prior Publication Data

US 2023/0170379 A1 Jun. 1, 2023

Related U.S. Application Data

(62) Division of application No. 17/190,813, filed on Mar. 3, 2021, now Pat. No. 11,600,656.

(60) Provisional application No. 63/125,098, filed on Dec. 14, 2020.

(51) Int. Cl.
*H01L 27/15* (2006.01)

(52) U.S. Cl.
CPC .................................. *H01L 27/156* (2013.01)

(58) Field of Classification Search
None
See application file for complete search history.

(56) References Cited

U.S. PATENT DOCUMENTS

| | | | |
|---|---|---|---|
| 6,410,942 B1 | 6/2002 | Thibeault et al. | |
| 6,657,236 B1 | 12/2003 | Thibeault et al. | |
| 6,821,804 B2 | 11/2004 | Thibeault et al. | |
| 7,943,406 B2 | 5/2011 | Slater, Jr. et al. | |
| 8,222,811 B2 | 7/2012 | Vaufrey et al. | |
| 8,258,044 B2 | 9/2012 | Brun et al. | |
| 8,487,340 B2 | 7/2013 | Gilet et al. | |
| 8,638,032 B2 | 1/2014 | Maindron et al. | |
| 8,647,957 B2 | 2/2014 | Borowik et al. | |
| 8,697,548 B2 | 4/2014 | Borowik et al. | |
| 8,698,396 B2 | 4/2014 | Maindron et al. | |
| 8,754,426 B2 | 6/2014 | Marx et al. | |
| 8,890,111 B2 | 11/2014 | Templier et al. | |
| 8,969,900 B2 | 3/2015 | Sabathil et al. | |
| 9,093,607 B2 | 7/2015 | Gilet et al. | |
| 9,109,296 B2 | 8/2015 | Metaye et al. | |

(Continued)

FOREIGN PATENT DOCUMENTS

| | | |
|---|---|---|
| CN | 101257081 A | 9/2008 |
| CN | 102460743 A | 5/2012 |

(Continued)

OTHER PUBLICATIONS

PCT International Search Report and Written Opinion in PCT/US2021/051176 dated Jan. 10, 2022, 9 pages.

*Primary Examiner* — Robert K Carpenter
(74) *Attorney, Agent, or Firm* — SERVILLA WHITNEY LLC

(57) ABSTRACT

Described are light emitting diode (LED) devices including a combination of electroluminescent and photo-luminescent active regions in the same wafer to provide LEDs with emission spectra that are adjustable after epitaxial growth. The LED device includes a multilayer anode contact comprising a reflecting metal and at least one transparent conducting oxide layer in between the metal and the p-type layer surface. The thickness of the transparent conducting oxide layer may vary for LEDs fabricated with different emission spectra.

20 Claims, 6 Drawing Sheets

(56) References Cited

U.S. PATENT DOCUMENTS

| | | | |
|---|---|---|---|
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,859,330 B2 | 1/2018 | Von Malm et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 11,476,386 B2 * | 10/2022 | Wildeson ............... H01L 33/08 |
| 11,600,656 B2 * | 3/2023 | Armitage ............... H01L 33/08 |
| 2002/0139987 A1 | 10/2002 | Collins, III et al. |
| 2006/0071228 A1 | 4/2006 | Sun |
| 2007/0206130 A1 | 9/2007 | Wuu et al. |
| 2008/0099787 A1 | 5/2008 | Coolbaugh et al. |
| 2008/0173884 A1 | 7/2008 | Chitnis et al. |
| 2008/0179602 A1 | 7/2008 | Negley et al. |
| 2010/0025712 A1 | 2/2010 | Weyers et al. |
| 2010/0078656 A1 | 4/2010 | Seo et al. |
| 2010/0264401 A1 | 10/2010 | Adivarahan et al. |
| 2011/0073838 A1 | 3/2011 | Khan et al. |
| 2011/0151607 A1 | 6/2011 | Landis et al. |
| 2011/0287606 A1 | 11/2011 | Brun et al. |
| 2012/0050694 A1 | 3/2012 | Huang et al. |
| 2012/0091481 A1 | 4/2012 | Sekine et al. |
| 2012/0205614 A1 | 8/2012 | Templier et al. |
| 2013/0020115 A1 | 1/2013 | Mataye et al. |
| 2013/0112945 A1 | 5/2013 | Gilet et al. |
| 2013/0256708 A1 | 10/2013 | Jin et al. |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2014/0367695 A1 | 12/2014 | Barlow |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2016/0336483 A1 | 11/2016 | Shatalov et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0294418 A1 | 10/2017 | Edmond et al. |
| 2017/0309794 A1 | 10/2017 | Von Malm |
| 2017/0358563 A1 | 12/2017 | Cho et al. |
| 2017/0358714 A1 | 12/2017 | Seong et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2019/0393379 A1 | 12/2019 | Armitage et al. |

FOREIGN PATENT DOCUMENTS

| | | |
|---|---|---|
| DE | 102010051286 A1 | 5/2012 |
| DE | 102012109460 A1 | 4/2014 |
| DE | 102014112551 A1 | 3/2016 |
| EP | 1378949 A1 | 1/2004 |
| EP | 2006921 A1 | 12/2008 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 341003 A1 | 12/2018 |
| EP | 3410002 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2001015452 A | 1/2001 |
| JP | 2004153271 A | 5/2004 |
| JP | 2011086882 A | 4/2011 |
| JP | 2015525973 A | 9/2015 |
| JP | 2016066765 A | 4/2016 |
| JP | 2020036038 A | 3/2020 |
| JP | 6780083 B1 | 11/2020 |
| KR | 20140118466 A | 10/2014 |
| KR | 20170018687 A | 2/2017 |
| KR | 20180010670 A | 1/2018 |
| KR | 20180114413 A | 10/2018 |
| TW | 201417339 A | 5/2014 |
| TW | 201620163 A | 6/2016 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017089676 A1 | 6/2017 |
| WO | 2017102708 A1 | 6/2017 |
| WO | 2017184686 A | 10/2017 |
| WO | 2017216445 A1 | 12/2017 |
| WO | 2018091657 A1 | 5/2018 |

(56) References Cited

FOREIGN PATENT DOCUMENTS

| | | |
|---|---|---|
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019126539 A | 6/2019 |

* cited by examiner

LIGHT EMITTING DIODE DEVICE

CROSS-REFERENCE TO RELATED APPLICATIONS

This application is a Divisional of U.S. application Ser. No. 17/190,813, filed on Mar. 3, 2021, which claims priority to U.S. Provisional Application No. 63/125,098, filed Dec. 14, 2020, the entire disclosures of which are hereby incorporated by reference herein.

TECHNICAL FIELD

Embodiments of the disclosure generally relate to arrays of light emitting diode (LED) devices and methods of manufacturing the same. More particularly, embodiments are directed to light emitting diode devices including photoluminescent quantum wells and electroluminescent quantum wells, and a bilayer contact.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

Typically the emission spectrum of an LED wafer is fixed (unchangeable) after epitaxial growth. If different spectral characteristics are desired, a different wafer must be grown. Having the capability to adjust the emission spectrum of an LED wafer as part of the die fabrication process after epitaxial growth could be advantageous. For example, LEDs with different emission spectra could be fabricated in close proximity to each other on the same wafer. This property could be applied to the manufacture of display and camera flash modules, where it is difficult and costly to pick and place LEDs from different wafers (or from different locations on a given wafer) into the module. Another advantage is that unintentional color differences within a given wafer (or between wafers grown by the same epitaxy process) might be compensated, facilitating implementation of technologies such as wafer-level phosphor integration.

Accordingly, there is a need for LED devices where the emission spectrum is able to be adjusted after epitaxial growth.

SUMMARY

Embodiments of the disclosure are directed to LED devices and methods for manufacturing LED devices. In one or more embodiments, a light emitting diode (LED) device comprises: a mesa array comprising a first mesa and a second mesa separated by a trench, the first mesa and the second mesa comprising a photoluminescent quantum well, an n-type layer on the photoluminescent quantum well, an electroluminescent quantum well on the n-type layer, and a p-type layer on the electroluminescent quantum well, the first mesa comprising a multilayer contact on the p-type layer and the second mesa comprising a p-type contact on the p-type layer, the trench having at least one side wall and extending to an n-type current spreading layer on a substrate.

Other embodiments of the disclosure are directed to a light emitting diode (LED) device comprising: a mesa array comprising a first mesa and a second mesa separated by a trench, the first mesa and the second mesa comprising a photoluminescent quantum well, an n-type layer on the photoluminescent quantum well, an electroluminescent quantum well on the n-type layer, and a p-type layer on the electroluminescent quantum well, the first mesa comprising a first contact on the p-type layer, the first contact comprising a first reflecting metal layer on a first transparent conductive oxide layer, the first transparent conductive oxide layer having a first thickness, and the second mesa comprising a second contact on the p-type layer, the second contact comprising a second reflecting metal layer on a second transparent conductive oxide layer, the second transparent conductive oxide layer having a second thickness, and the trench having at least one side wall and extending to an n-type current spreading layer on a substrate.

One or more embodiments are directed to a method of manufacturing an LED device. In one or more embodiments, the method comprises: forming a nucleation layer on a substrate; forming a defect reduction layer on the nucleation layer; forming an n-type current spreading layer on the defect reduction layer; forming at least one photoluminescent quantum well on the n-type current spreading layer; forming an n-type layer on the at least one photoluminescent quantum well; forming at least one electroluminescent quantum well on the n-type layer; forming a p-type layer on the electroluminescent quantum well; etching to form a first mesa and a second mesa separated by a trench, the trench having at least one side wall and extending to the n-type current spreading layer; conformally depositing a dielectric layer on the first mesa and the second mesa; forming a contact hole in the first mesa and the second mesa; and forming a first contact on the first mesa and a second contact on the second mesa.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Figure 1:
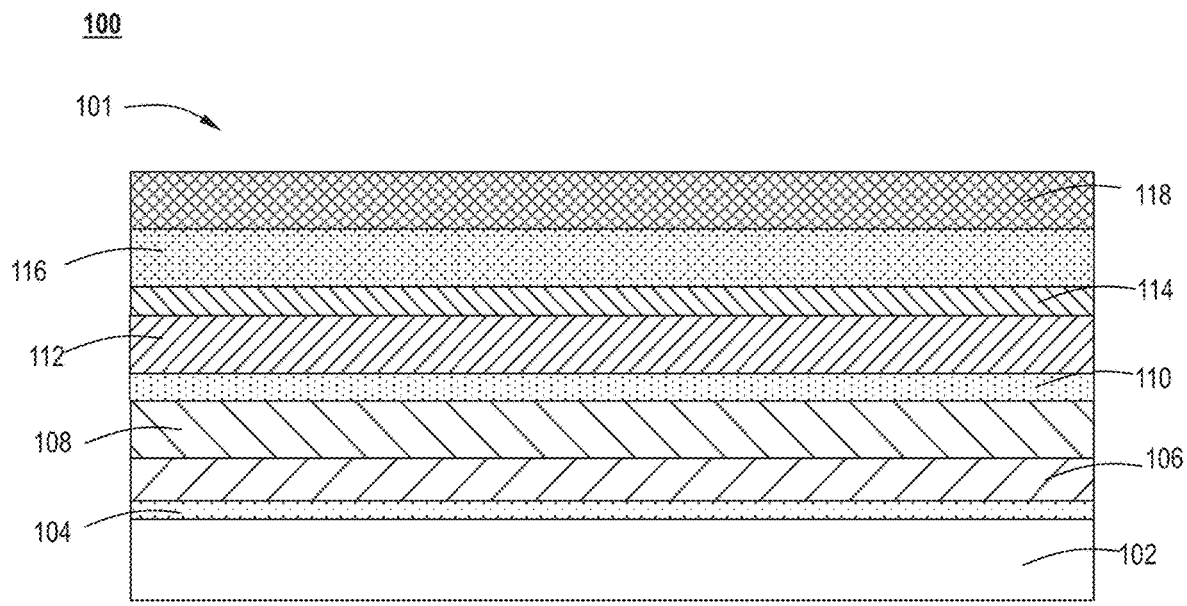
FIG. 1 illustrates a cross-sectional view of an LED device including multiple quantum wells according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe LED devices and methods for forming LED devices. In particular, the present disclosure describes LED devices and methods to produce LED devices which advantageously use a combination of electroluminescent and photo-luminescent active regions in the same wafer to provide LEDs with emission spectra that are adjustable after epitaxial growth. In one or more embodiments, the adjustment is achieved via wafer fabrication processes that controllably alter the fraction of electroluminescent emission that is absorbed in the photo-luminescent active region. These adjustments include changing the optical path length between a reflecting anode contact and the electroluminescent emitting quantum wells, and/or by the application of low-loss wavelength selective reflector coatings to exterior surfaces of the LED chip.

In one or more embodiments, the emission spectrum of an LED can be changed by post-growth wafer processing that is localized at the chip level, thus providing LEDs of different emission spectra from the same LED wafer. In one or more embodiments, an array of LEDs with different emission spectra in close proximity to each other in the same wafer can be built. The need to grow multiple (different) types of epitaxial wafers and the need to manipulate chips from separate wafers to form an array is advantageously avoided.

In one or more embodiments, a gallium nitride (GaN)-based LED wafer contains two or more groups of quantum wells of different emission wavelengths in the same wafer. A first group of electroluminescent quantum wells (with shortest emission wavelength) may be located between a p-type layer and a first n-type layer, which forms a p-n junction with the p-type layer. A second (and third, or more) group of photoluminescent quantum wells with longer emission wavelength may be located between the n-type layer of the p-n junction and an n-type GaN current spreading layer. These quantum wells have non-negligible absorption coefficient at the wavelength of the electroluminescence emitting by the first group of quantum wells.

In one or more embodiments, the LED device includes a multilayer anode contact comprising a reflecting metal and at least one transparent conducting oxide layer in between the metal and the p-GaN surface. The thickness of the transparent conducting oxide layer may vary for LED fabricated with different emission spectra.

In one or more embodiments, the LED device includes an optional optical coating on the back side of a polished sapphire substrate, which is part of the finished LED chip. The coating has low optical losses and higher reflectivity at the wavelength of electroluminescence vs. the wavelength(s) of photoluminescence.

The embodiments of the disclosure are described by way of the Figures, which illustrate devices (e.g. transistors) and processes for forming devices in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. FIGS. 1 through 6A and FIG. 7 illustrate cross-sectional views of a device 100 according to one or more embodiments. FIG. 6B illustrates a top view of the device 100 according to one or more embodiments.

An aspect of the disclosure pertains to a method of manufacturing a LED array. Referring to FIG. 1, a LED device 100 is manufactured by a photoluminescent quantum well 112 and an electroluminescent quantum well 116 on a substrate 102.

In one or more embodiments, the first part of the epitaxy involves the growth of a nucleation layer 104, a defect reduction layer 106, and an n-type current spreading layer 108 and may be the same as in a conventional LED growth run using a sapphire or other applicable growth substrate 102.

The substrate 102 may be any substrate known to one of skill in the art which is configured for use in the formation of LED devices. In one or more embodiments, the substrate 102 comprises one or more of sapphire, silicon carbide, silica (Si), quartz, magnesium oxide (MgO), zinc oxide (ZnO), spinel, and the like. In one or more embodiments, the substrate 102 is a transparent substrate. In specific embodiments, the substrate 102 comprises sapphire. In one or more embodiments, the substrate 102 is not patterned prior to formation of the LEDs. Thus, in some embodiments, the substrate is 102 not patterned and can be considered to be flat or substantially flat. In other embodiments, the substrate 102 is a patterned substrate.

In one or more embodiments, the n-type current spreading layer 108 may comprise any Group III-V semiconductors, including binary, ternary, and quaternary alloys of gallium (Ga), aluminum (Al), indium (In), and nitrogen (N), also referred to as III-nitride materials. Thus, in some embodiments, the n-type current spreading layer 108 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In a specific embodiment, the n-type current spreading layer 108 comprises gallium nitride (GaN). In one or more embodiments, the n-type current spreading layer 108 is doped with n-type dopants, such as silicon (Si) or germanium (Ge). The n-type current spreading layer 108 may have a dopant concentration significant enough to carry an electric current laterally through the layer.

In one or more embodiments, the layers of III-nitride material which form the first LED, the second LED and the third LED are deposited by one or more of sputter deposition, atomic layer deposition (ALD), metalorganic chemical vapor deposition (MOCVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g. a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. A particular subset of CVD processes commonly used in LED manufacturing use metalorganic precursor chemical and are referred to as MOCVD or metalorganic vapor phase epitaxy (MOVPE). As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. In a PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step may be conducted between the deliveries of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, a LED device 100 is manufactured by placing the substrate 102 in a metalorganic vapor-phase epitaxy (MOVPE) reactor so that the LED device layers are grown epitaxially.

In one or more embodiments, a nucleation layer 104 is formed on the substrate 102 prior to the defect reduction layer 106. In one or more embodiments, the nucleation layer comprises a III-nitride material. In specific embodiments, the nucleation layer 104 comprises gallium nitride (GaN) or aluminum nitride (AlN).

In one or more embodiments, a plurality of photoluminescence emitting quantum wells 112 is grown on the current spreading layer 108, with dilute indium concentration layer(s) 110 optionally grown before the photoluminescent quantum wells 112. The photoluminescent quantum wells 112 may be doped n-type with silicon (Si) or germanium (Ge) to minimize the voltage drop across the photoluminescent quantum wells 112.

The photoluminescent quantum wells 112 may be formed using any deposition technique known to one of skill in the art. The photoluminescent quantum wells 112 may comprise a sequence of multiple quantum wells emitting the same wavelength of light. The photoluminescent quantum wells 112 may comprise different layers of indium gallium nitride (InGaN) and gallium nitride (GaN). In one or more embodiments, the photoluminescent quantum wells 112 may emit a wavelength in a range about 500 nm to about 650 nm. The emission color may be controlled by the relative mole fractions of indium (In) and gallium (Ga) in the InGaN layer and/or by the thicknesses of the multiple quantum wells. In some embodiments, a higher mole fraction of indium (In) may result in a longer wavelength.

In one or more embodiments, an individual quantum well within the photoluminescent quantum wells 112 may have an InGaN thickness in a range of from about 0.5 nm to about 10 nm and a GaN barrier thickness in a range of from about 2 nm to about 100 nm. The total number of quantum wells in the photoluminescent quantum wells 112 may be in a range of from 1 to 50.

In one or more embodiments, after the growth of the photoluminescent quantum wells 112, an n-type layer 114 is grown on a top surface of the photoluminescent quantum wells 112. The n-type layer 114 may be very thin, or it could be much thicker with thickness in the tens or hundreds of nanometers. In one or more embodiments, the n-type layer 114 may have the property of modifying the growth surface to favorably affect the efficiency or forward voltage of the electroluminescent active region to be grown subsequently.

In one or more embodiments, after the growth of n-type layer 114, an electroluminescence-emitting active region, or electroluminescence quantum wells 116, followed by electron blocking layers and p-type layers 118 is grown using deposition techniques known to one of skill in the art. In one or more embodiments, the p-type layers 118 comprise gallium nitride (GaN). In some embodiments, the thickness of the p-type layer 118 may be co-optimized with the anode contact layers discussed below.

In one or more embodiments, the wafer 101 grown as described above is used to fabricate LED chips with a reflecting anode contact and emitting light in the direction opposite the anode contact. The fraction of electroluminescence that is absorbed in the photoluminescent quantum wells 112 depends on the angular radiation pattern of the emitted electroluminescence. Radiation emitted at small angles near the surface normal has a high probability of escaping from the chip without absorption, while radiation emitted at large angles has a high probability of being absorbed in the photoluminescent quantum wells 112 and re-emitted as photons of longer wavelength. The angular radiation pattern of electroluminescence is, in turn, very sensitive to the optical path length from the electroluminescence quantum wells 116 to the reflecting anode contact. Depending on the particular path length, constructive interference may occur at larger or smaller angles.

In one or more embodiments, the electroluminescent quantum wells 116 emit a first light having a first wavelength and the photoluminescent quantum wells 112 absorb at least a portion of the first light and emit a second light having a longer wavelength than the first light.

Figure 2:
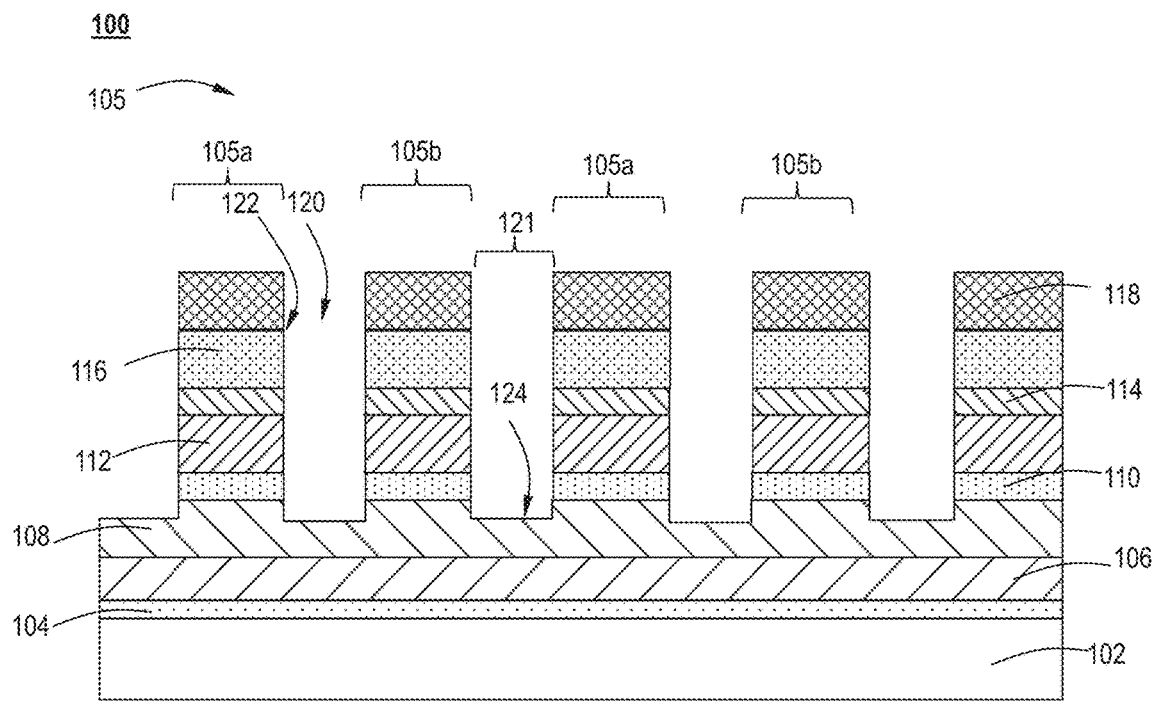
FIG. 2 illustrates a cross-sectional view of an LED device including multiple quantum wells according to one or more embodiments.

Referring to FIG. 2, a mesa array 105 is formed by etching a first mesa 105a and a second mesa 105b into the wafer 101. In one or more embodiments, the first mesa 105a and the second mesa 105b are separated by a trench 120. In some embodiments, the trench 120 may be formed using a conventional directional etching process, such as dry etching. The trench 120 may be any suitable depth and may extend from the top surface of the p-type layer 118 through to the n-type current spreading layer 108. The trench 120 may comprise at least one sidewall 122 and a bottom surface 124. In one or more embodiments, the bottom surface 124 comprises the n-type current spreading layer 108. In one or more embodiments, the trench 120 may define an emitting area 121.

Figure 3:
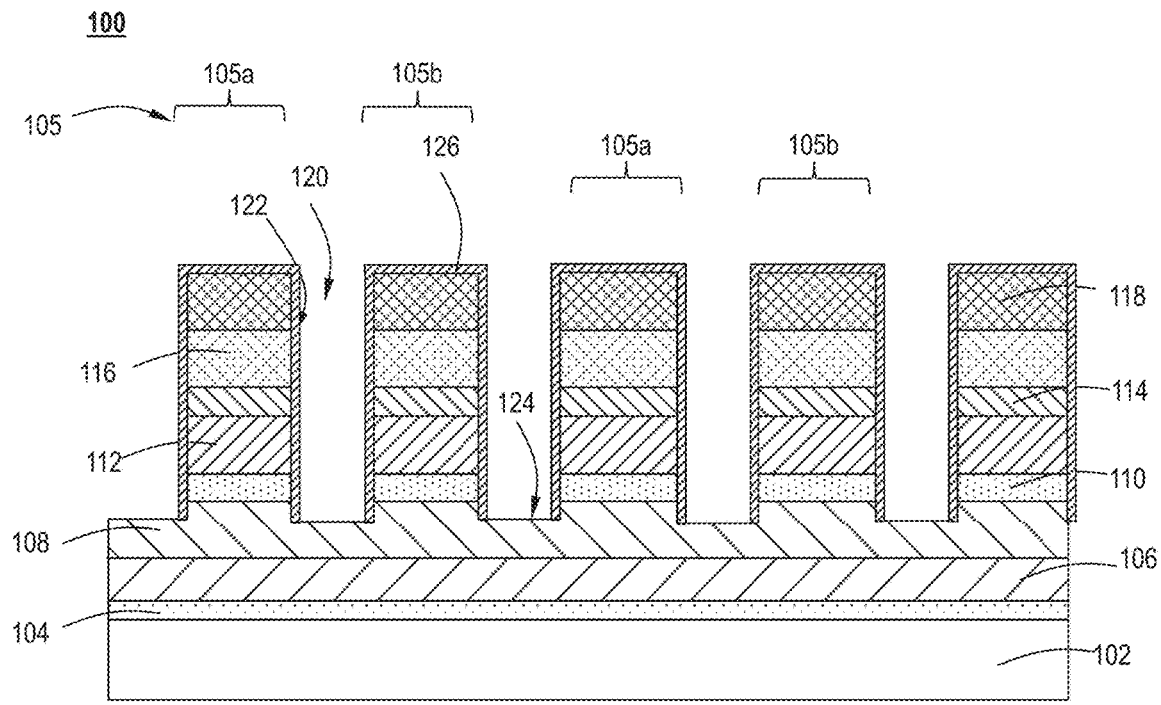
FIG. 3 illustrates a cross-sectional view of an LED device including multiple quantum wells according to one or more embodiments.

FIG. 3 shows formation of a dielectric layer 126 in the trench 120 and on the p-type layer 118. The dielectric layer 126 may be formed using a conventional deposition technique, such as, for example, CVD, PECVD, ALD, evaporation, sputtering, chemical solution deposition, spin-on deposition, or other like processes.

As used herein, the term "dielectric" refers to an electrical insulator material that can be polarized by an applied electric field. In one or more embodiments, the dielectric layer 126 may comprise any suitable dielectric material known to the skilled artisan. In some embodiments, the dielectric material comprises one of more of silicon nitride (SiN), titanium oxide ($TiO_x$), niobium oxide ($NbO_x$), aluminum oxide ($AlO_x$), hafnium oxide ($HfO_x$), tantalum oxide ($TaO_x$), aluminum nitride (AlN), silicon oxide ($SiO_x$), and hafnium-doped silicon dioxide ($HfSiO_x$). While the term "silicon oxide" may be used to describe the conformal dielectric layer 126, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. In one or more embodiments, the dielectric layer 126 has a thickness greater than about 300 nm, or greater than about 500 nm, or greater than about 1000 nm.

In one or more embodiments, the dielectric layer 126 is substantially conformal. As used herein, a layer which is "substantially conformal" refers to a layer where the thickness is about the same throughout (e.g., on p-type layer 118, on the at least one sidewall 122, and on the bottom surface 124 of the trench 120). A layer which is substantially conformal varies in thickness by less than or equal to about 5%, 2%, 1% or 0.5%.

In some embodiments, the dielectric layer 126 forms on the bottom surface 124 of the trench 120. In other embodiments, the dielectric layer 126 is not on the bottom surface 124 of the trench 120 and the n-type current spreading layer 108 is exposed on the bottom surface 124 of the trench 120. Portions of the dielectric layer 126 may be removed from the bottom surface 124 of the trench 120. The portions of the dielectric layer 126 may be removed using a conventional directional etching process, such as dry etching.

Figure 4:
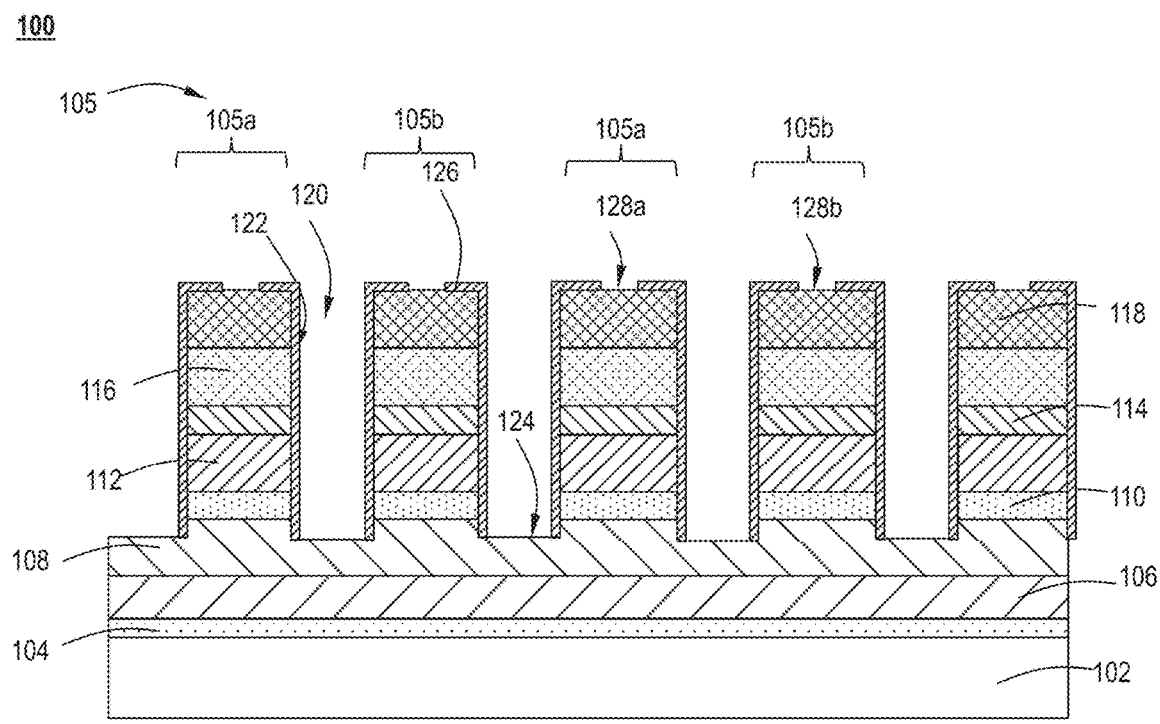
FIG. 4 illustrates a cross-sectional view of an LED device including multiple quantum wells according to one or more embodiments.

FIG. 4 shows formation of a contact hole 128 in the dielectric layer 126. In some embodiments a first contact hole 128a is formed in the dielectric layer 126 of the first mesa 105a. A second contact hole 128b may be formed in the dielectric layer 126 of the second mesa 105b. The contact hole 128a, 128b may be formed using a conventional directional etching process, such as dry etching.

Figure 5:
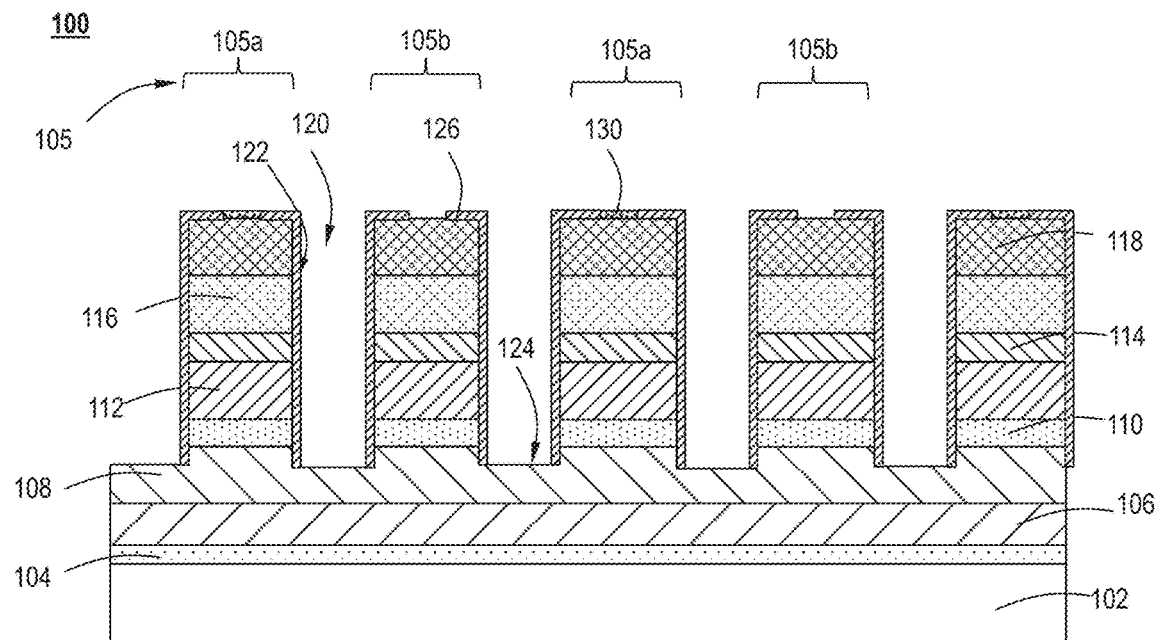
FIG. 5 illustrates a cross-sectional view of an LED device including multiple quantum wells according to one or more embodiments.

With reference to FIG. 5, a transparent conductive oxide (TCO) layer 130 may be selectively deposited in the first contact hole 128a of the first mesa 105a and not in the second contact hole 128b of the second mesa 105b. In one or more embodiments, the transparent conductive oxide layer 130 comprises one or more of indium-doped tin oxide, aluminum-doped zinc oxide, indium-doped cadmium oxide, indium oxide, tin oxide, fluorine-doped tin oxide, copper aluminum oxide, strontium copper oxide, and zinc-doped tin oxide. In one or more specific embodiments, the transparent conductive oxide layer 130 comprises one or more of indium tin oxide (ITO), gallium oxide ($Ga_2O_3$), zinc oxide (ZnO), tin oxide ($SnO_2$), and indium zinc oxide (InZnO). The TCO layer 130 may be comprised of two or more sub-layers with one of the sub-layers exhibiting the characteristic of lower electrical contact resistance to p-type GaN and other sub-layer(s) exhibiting the characteristic of reduced optical absorption coefficient. The sub-layers may be different materials selected from the list above, or they may be two layers of nominally the same material with differences in deposition and/or annealing process conditions. In specific embodiments, the transparent conductive oxide layer 130 comprised indium tin oxide (ITO).

Figure 6A:
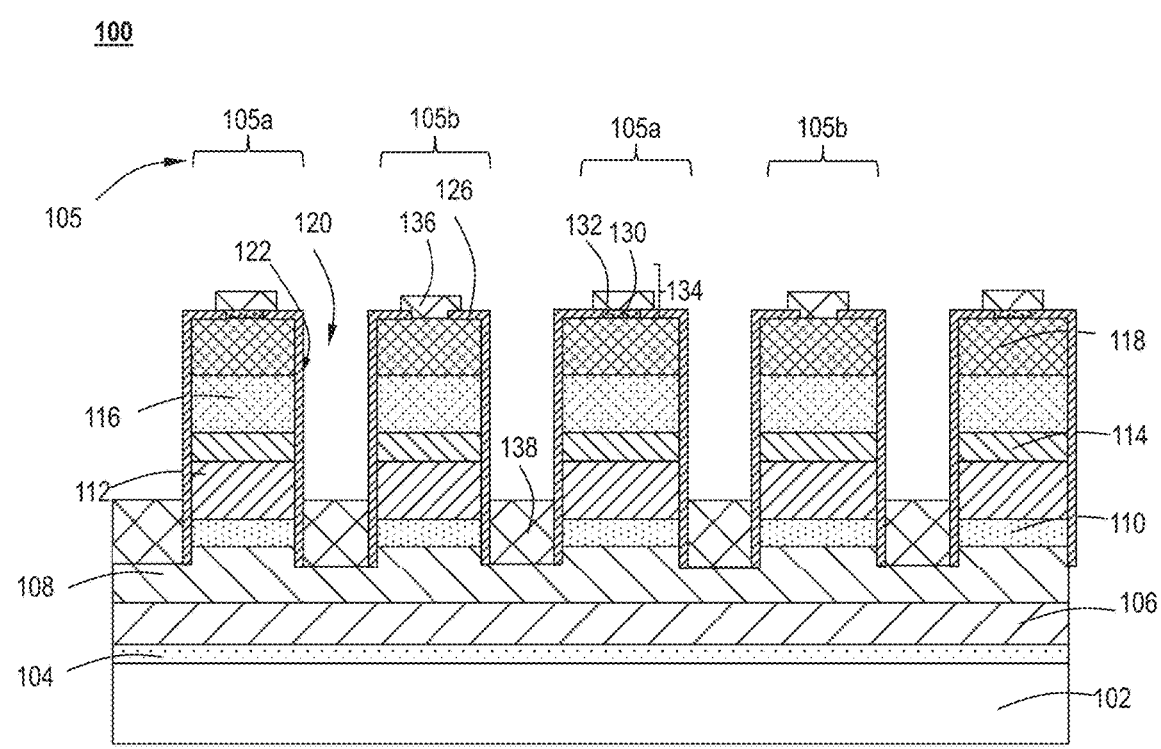
FIG. 6A illustrates a cross-sectional view of an LED device including multiple quantum wells according to one or more embodiments.
Figure 6B:
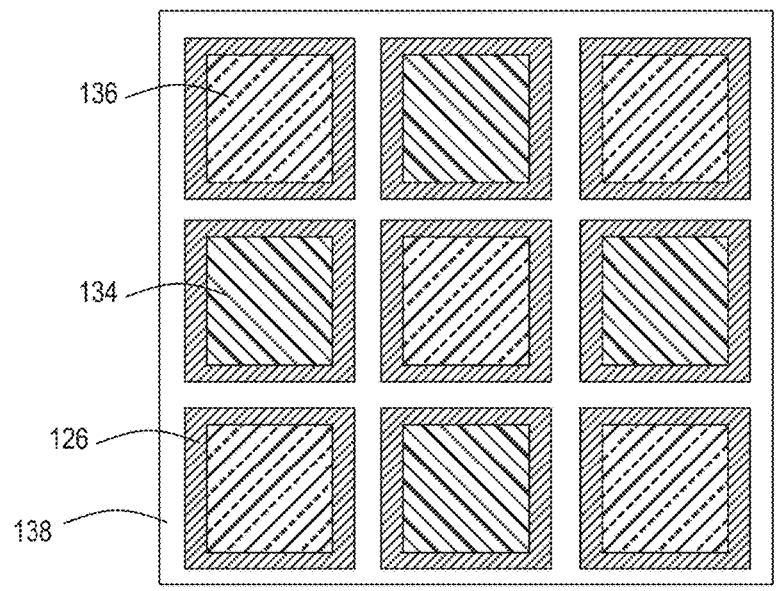
FIG. 6B illustrates a top view of an LED device including multiple quantum wells according to one or more embodiments.

Referring to FIG. 6A, an anode contact metal 132 is deposited on the first mesa 105a. In one or more embodiments, the anode contact metal 132 may comprise any suitable material known to the skilled artisan. In one or more embodiments, the anode contact metal 132 comprises a p-contact material selected from one or more of aluminum (Al), silver (Ag), gold (Au), platinum (Pt), and palladium (Pd). In specific embodiments, the anode contact metal 132 comprises silver (Ag). In some embodiments, additional metals may be added in small quantities to the anode contact metal as adhesion promoters. Such adhesion promoters, include, but are not limited to, one or more of nickel (Ni), titanium (Ti), and chromium (Cr).

In one or more embodiments, deposition of the anode contact metal 132 on the first mesa 105a forms a bilayer contact 134. The bilayer contact 134 comprises a transparent conductive oxide layer 130 and an anode contact metal 132, e.g. a reflecting metal layer. In other embodiments, deposition of the anode contact metal 132 on the first mesa 105a forms a multilayer contact. As used herein, the term "multilayer contact" refers to the case of a non-conducting dielectric material interposed between the TCO layer 130 and the anode contact metal 132. A plurality of via holes are patterned through the dielectric allowing the metal to touch the TCO layer. The multilayer contact has the advantage that non-conducting dielectric materials such as silicon oxide ($SiO_2$) tend to have lower optical absorption coefficients than TCO materials. In other words, the multilayer contact may provide the same difference in optical path obtained with the bilayer contact, but with a lower absorption loss per pass due to reduced thickness of absorbing TCO material. The non-conducting dielectric material may be comprised of one or more layers with differing refractive indices selected from a group that includes but is not limited to silicon oxide ($SiO_2$), silicon nitride ($SiN_x$), niobium oxide ($Nb_2O_5$), zirconium oxide ($ZrO_2$), aluminum oxide ($Al_2O_3$), and titanium oxide ($TiO_2$).

In one or more embodiments, a second anode contact metal 136 is deposited on the second mesa 105b. In one or more embodiments, the second anode contact metal 136 may comprise any suitable material known to the skilled artisan. In one or more embodiments, the second anode contact metal 136 comprises a p-contact material selected from one or more of aluminum (Al), silver (Ag), gold (Au), platinum (Pt), and palladium (Pd). In specific embodiments, the second anode contact metal 136 comprises silver (Ag). In some embodiments, additional metals may be added in small quantities to the second anode contact metal as adhesion promoters. Such adhesion promoters, include, but are not limited to, one or more of nickel (Ni), titanium (Ti), and chromium (Cr).

Figure 8:
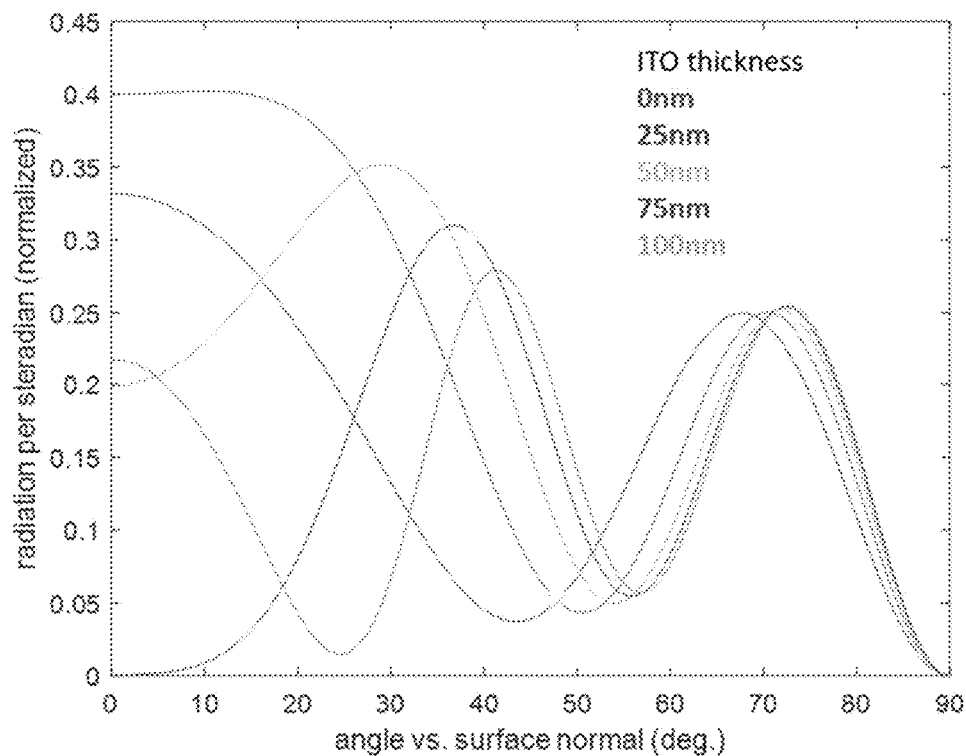
FIG. 8 is a graph illustrating the calculated angular radiation distributions in GaN for radiation reflected by a p-type layer with a bilayer contact.

In one or more embodiments, the dependence of the internal radiation pattern on the thickness of a transparent conducting oxide (TCO) layer 130 placed between the p-type layer 118 and the anode contact metal 132 is shown in FIG. 8. Specifically, FIG. 8 illustrates the calculated angular radiation distributions in p-type layer 118 for radiation reflected by a p-type layer 118/transparent conducting oxide (TCO) layer 130/anode contact metal 132. The emitting radiation has a centroid wavelength of about 445 nm and the emitting quantum well is at a distance of about 100 nm from the p-type layer 118/transparent conducting oxide (TCO) layer 130 interface. The radiation distributions associated with thicker transparent conducting oxide (TCO) layer 130 result in more of the 445 nm radiation being absorbed inside the LED chip, compared to those of smaller transparent conducting oxide (TCO) layer 130 thickness or no transparent conducting oxide (TCO) layer 130. It should be emphasized the above result is specific to LEDs having a distance of about 100 nm between the emitting QWs and the p-GaN/TCO interface. In general the absorption of 445 nm radiation depends on both the TCO thickness and the distance to said interface.

Figure 9:
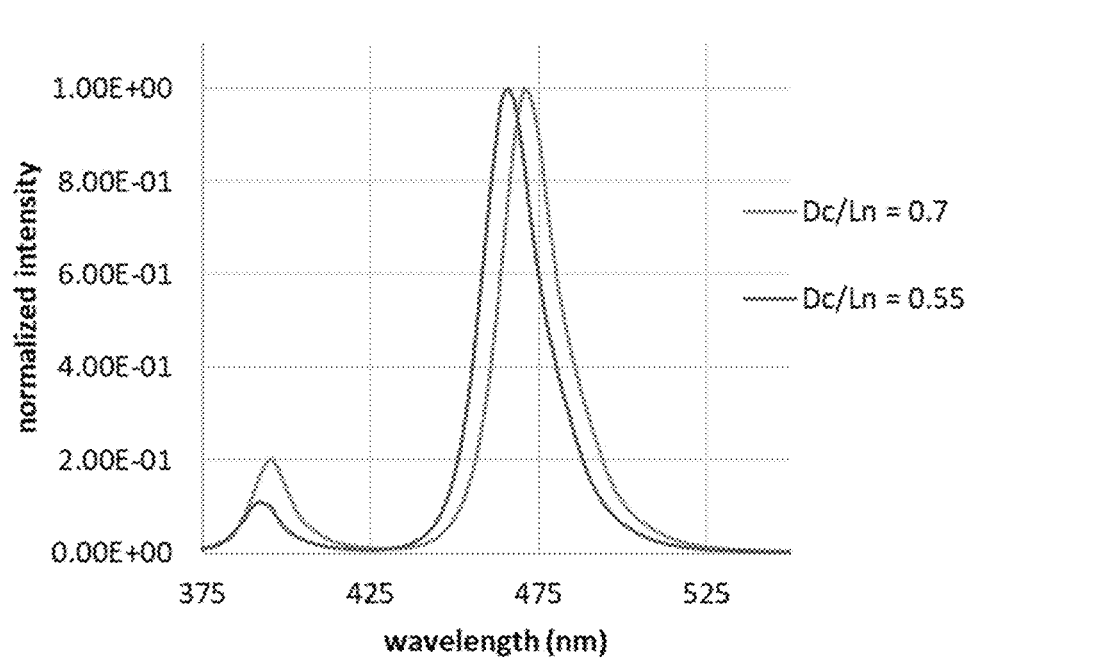
FIG. 9 is a graph illustrating spectra for LEDs with different optical path lengths between near-UV electroluminescent quantum wells and an anode contact metal.

FIG. 9 illustrates an experimental example of different spectra produced in this way. Specifically, in FIG. 9, experimental spectra for LEDs with different optical path lengths between near-UV electroluminescent QWs and anode contact metal 132 are illustrated. Internal absorption of the near-UV emission is enhanced for Dc/Ln=0.55. As used herein, "Dc/Ln" refers to the optical path length between the anode contact metal and emitting quantum wells, expressed as a fraction of a wavelength. The longer wavelength (photoluminescence) emission has higher intensity relative to the p-type layer 118 and transparent conducting oxide (TCO) layer 130 thickness was configured to maximize interference at large angles versus the surface normal. FIG. 9 shows a proof of the physical principle underlying the invention, but the experimental implementation differs from one or more embodiments of the invention. No TCO layer was used in the experiment shown in FIG. 9. For FIG. 9 two wafers were grown with a difference in p-GaN thickness that mimics the presence of the TCO layer disclosed in the invention.

In one or more embodiments, the thickness of the electron blocking layer (EBL) and p-type layer 118 is fixed by the epitaxial growth and this part of the optical path length cannot be changed in post-growth wafer fab processing. The phase shift of the anode contact metal 132, or p-type contact, can be controlled in post-growth processing by selecting different reflective metals to make the contact. The differences in phase shift of the various high reflectivity metals, however, are fairly small and may not produce a sufficiently large difference in the emission spectrum of the LED chip. In one or more embodiments, to control the optical path length in post-growth processing, a transparent conducting oxide (TCO) layer 130 of controlled thickness is used to make contact with the p-type layer 118, and then a reflecting metal, e.g. anode contact metal 132, is placed on top of the transparent conducting oxide (TCO) layer 130. In this arrangement the optical path length depends directly on the thickness of the transparent conducting oxide (TCO) layer 130 as well as the thickness of the p-type layer. The layer 130 could be comprised of multiple layers of conducting and/or non-conducting layers with low optical absorption losses. As shown in FIG. 6A and FIG. 6B, different LEDs adjacent to each other on the wafer can be made to have different emission spectra by using a transparent conducting oxide (TCO) layer 130 as the p-contact for some of the LEDs (e.g. first mesa 105a) and making an anode contact 136 directly to the p-type layer 118 surface for other LEDs (e.g. second mesa 105b). In one or more embodiments, the transparent conducting oxide (TCO) layer 130 may increase the path length from the electroluminescence quantum wells 116 to the anode contact metal 132 by about 0.2 wavelengths (here referring to the centroid wavelength of EL emission). The transparent conducting oxide (TCO) layer 130 may be patterned with HCl-based wet etching or dry etching before the anode contact metal 132 deposition.

Referring to FIG. 6A, in one or more embodiments, a cathode contact metal 138, or an n-type contact, is deposited in the trench 120. The LEDs in the array may, thus, share a common n-contact electrode as depicted in FIG. 6A. In one or more embodiments, the cathode contact metal 138 may comprise any suitable material known to the skilled artisan. In one or more embodiments, the cathode contact metal 138 comprises an n-contact material selected from one or more of aluminum (Al), titanium (Ti), and chromium (Cr).

In one or more embodiments, it would also be possible, instead of using the array of anode contact 136/p-type layer 118 and anode contact metal 132/transparent conducting oxide (TCO) layer 130/p-type layer 118 LEDs as shown in FIG. 6A, to instead use an array with anode contact metal 132/transparent conducting oxide (TCO) layer 130/p-type layer 118 LEDs of differing transparent conducting oxide (TCO) layer 130 thickness. This approach may produce the same effect as the one shown in FIG. 6A provided that the p-type layer 118 thickness has been co-optimized in conjunction with the two transparent conducting oxide (TCO) layer thickness levels. The approach shown in FIG. 6A has the advantage that it can be implemented with a relatively simple etching process and only one transparent conducting oxide (TCO) layer deposition step.

In general, the etched surface (trench 120) may have an angle of inclination up to 45 degrees, and does not have to be completely vertical as shown in the simplified illustration of FIG. 6A. While the array shown in FIG. 6A includes a regular pattern of equal numbers of anode contact-only LEDs and anode contact/transparent conducting oxide (TCO) layer LEDs of equal sizes, the disclosure is not limited to arrays of the type shown. Some implementations could feature LEDs of different sizes, unequal numbers of the two types of anode contacts, and/or random spatial arrangements. Another implementation could include discrete LEDs with different emission spectra (not part of an array).

In one or more embodiments (not illustrated), an alternative processing embodiment versus the one illustrated in FIGS. 2 through 6A is for the mesa etch (trench 120) to extend all the way to the substrate 102 and for the cathode contact 138 to be formed to the side of the mesa 105a, 105b instead of on an exposed horizontal surface of the n-type current spreading layer 108 as shown in FIG. 6A.

Figure 7:
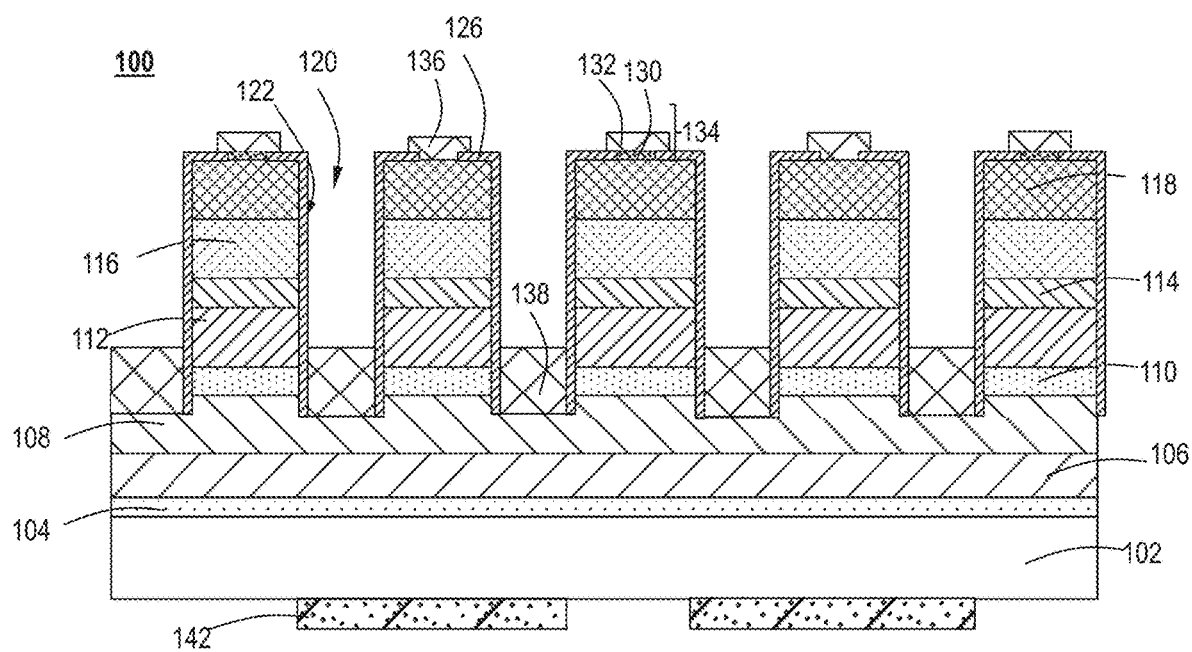
FIG. 7 illustrates a cross-sectional view of an LED device including multiple quantum wells according to one or more embodiments.

FIG. 7 illustrates the formation of an external wavelength-selective reflector coating 142 applied to the side of the device 100 opposite the anode contact 132/136. In one or more embodiments, the external wavelength-selective reflector coating 142 is a dichroic reflector or a dichroic mirror on a bottom surface of the substrate 102. The dichroic mirror may comprise a multilayer stack of dielectric layers with a large difference in refractive index, such as niobium oxide ($Nb_2O_5$) and silicon oxide ($SiO_2$), for example. In one or more embodiments, the external wavelength-selective reflector coating 142 comprises a multilayer dielectric coating utilizing thin-film interference effects designed to have higher reflectivity at shorter wavelengths versus longer wavelengths, further modifying the emission spectrum for an LED chip with the external coating has been applied versus one where it has not been applied. In one or more embodiments, the external wavelength-selective reflector coating 142 has a narrow spectral width and a low sensitivity to incident angle. In some embodiments, the external wavelength-selective reflector coating 142 is applicable in the case where the EL and PL emission peaks have a large separation in wavelength.

Figure 10:
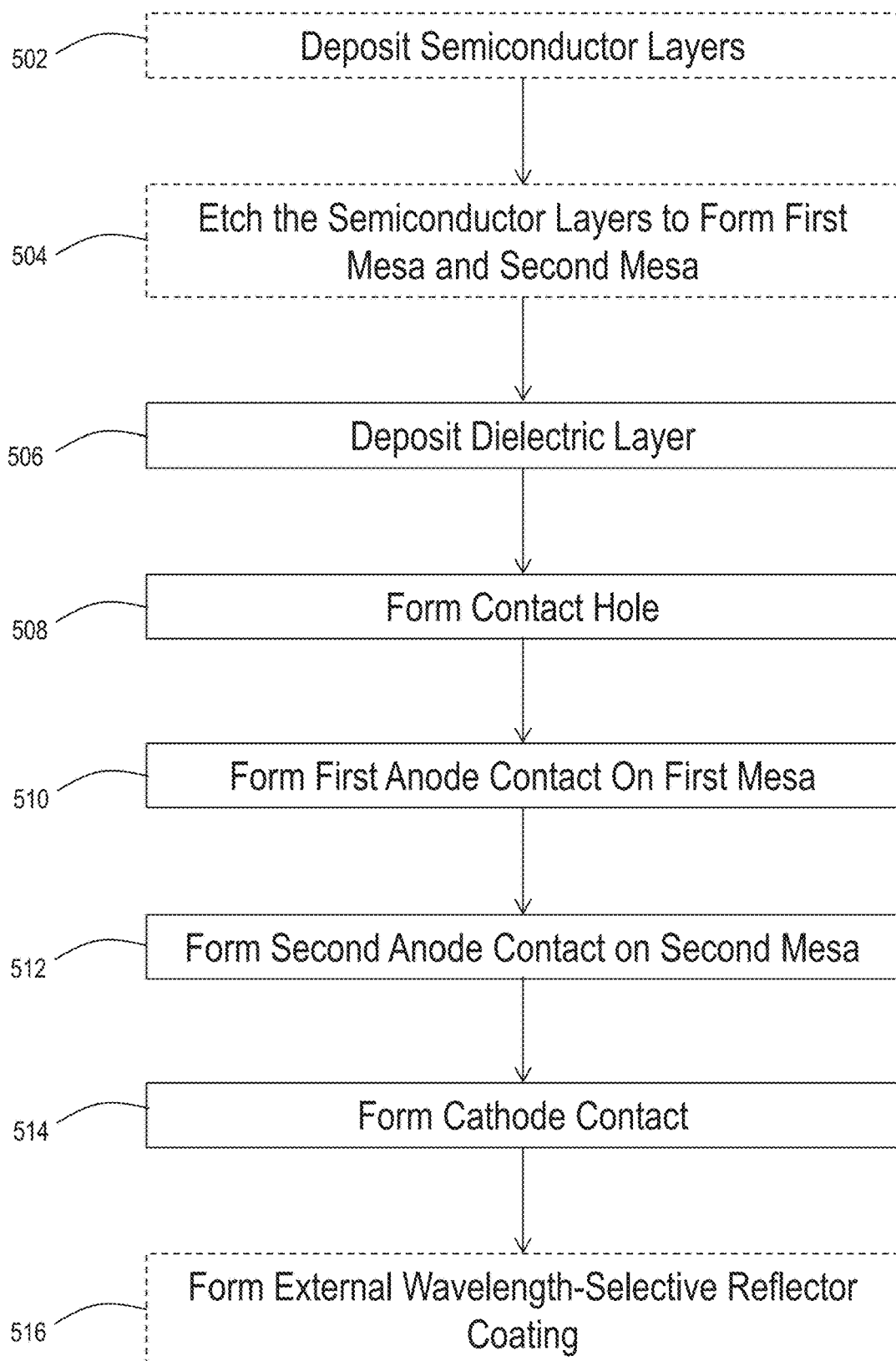
FIG. 10 illustrates a process flow diagram of a method according to one or more embodiments.

FIG. 10 illustrates a process flow diagram of a method 500 of manufacturing an LED device according to one or more embodiments. In one or more embodiments, a method of manufacturing a light emitting diode (LED) device begins at operation 502 where semiconductors layers are deposited or grown on a substrate. In one or more embodiments, the semiconductor layers comprises one or more of a substrate 102, a nucleation layer 104, a defect reduction layer 106, an n-type current spreading layer 108, a dilute indium concentration layer 110, photoluminescence quantum wells 112, an n-type layer 114, electroluminescence quantum wells 116, and a p-type layer 118. At operation 504, the semiconductor layers are etched to form at least a first mesa 105a and a second mesa 105b separated by a trench 120 and having a top surface and at least one sidewall 122. In some embodiments, the sidewall may define a trench having a depth and a bottom surface 124. At operation 506, a dielectric layer 126 is deposited on the semiconductor surface. In one or more embodiments, at operation 508, a contact hole 128 is formed.

At operation 510, a bilayer first anode contact is formed in the contact hole 128 on the first mesa 105a. The bilayer first anode contact comprises a transparent conductive oxide layer 130 and an anode contact layer 132. At operation 512, a second anode contact 136 is formed on the second mesa 105b.

At operation 514, a cathode contact metal 138 is deposited in the trench 120. The LEDs in the array may, thus, share a common n-contact electrode.

In some embodiments, the method 500 at operation 516 further comprises formation of an external wavelength-selective reflector coating 142 applied to the side of the device 100 opposite the anode contact 132/136. In one or more embodiments, the external wavelength-selective reflector coating 142 is a dichroic mirror on a bottom surface of the substrate 102.

Another aspect of the disclosure pertains to an electronics system. In one or more embodiments, an electronic system comprises the LED devices and arrays described herein and driver circuitry configured to provide independent voltages to one or more of p-contact layers. In one or more embodiments, the electronic system is selected from the group consisting of a LED-based luminaire, a light emitting strip, a light emitting sheet, an optical display, and a microLED display.

Embodiments

Various embodiments are listed below. It will be understood that the embodiments listed below may be combined with all aspects and other embodiments in accordance with the scope of the invention.

Embodiment (a). A light emitting diode (LED) device comprising: a mesa array comprising a first mesa and a second mesa separated by a trench, the first mesa and the second mesa comprising a photoluminescent quantum well, an n-type layer on the photoluminescent quantum well, an electroluminescent quantum well on the n-type layer, and a p-type layer on the electroluminescent quantum well, the first mesa comprising a multilayer contact on the p-type layer and the second mesa comprising a p-type contact on the p-type layer, the trench having at least one side wall and extending to an n-type current spreading layer on a substrate.

Embodiment (b). The LED device of embodiment (a), further comprising a nucleation layer on the substrate and a defect reduction layer on the nucleation layer.

Embodiment (c). The LED device of embodiments (a) to (b), wherein the multilayer contact is a bilayer contact comprising a reflecting metal layer on a transparent conductive oxide layer.

Embodiment (d). The LED device of embodiments (a) to (c), wherein the reflecting metal layer comprises one or more of silver (Ag), nickel (Ni), aluminium (Al), and titanium (Ti).

Embodiment (e). The LED device of embodiments (a) to (d), wherein the transparent conductive oxide layer comprises one or more of indium tin oxide (ITO), gallium oxide ($Ga_2O_3$), zinc oxide (ZnO), tin oxide ($SnO_2$), and indium zinc oxide (InZnO).

Embodiment (f). The LED device of embodiments (a) to (e), wherein the electroluminescent quantum well emits a first light having a first wavelength and the photoluminescent quantum well absorbs at least a portion of the first light and emits a second light having a longer wavelength than the first light.

Embodiment (g). The LED device of embodiments (a) to (f), further comprising an n-type contact in the trench on the n-type current spreading layer.

Embodiment (h). The LED device of embodiments (a) to (g), wherein the electroluminescent quantum well comprises multiple quantum wells emitting a same wavelength of light.

Embodiment (i). The LED device of embodiments (a) to (h), wherein the photoluminescent quantum well comprises multiple quantum wells emitting a same wavelength of light.

Embodiment (j). The LED device of embodiments (a) to (i), wherein the substrate is a transparent substrate.

Embodiment (k). The LED device of embodiments (a) to (j), further comprising a dichroic reflector on the substrate opposite the n-type current spreading layer.

Embodiment (l). A light emitting diode (LED) device comprising: a mesa array comprising a first mesa and a second mesa separated by a trench, the first mesa and the second mesa comprising a photoluminescent quantum well, an n-type layer on the photoluminescent quantum well, an electroluminescent quantum well on the n-type layer, and a p-type layer on the electroluminescent quantum well, the first mesa comprising a first contact on the p-type layer, the first contact comprising a first reflecting metal layer on a first transparent conductive oxide layer, the first transparent conductive oxide layer having a first thickness, the second mesa comprising a second contact on the p-type layer, the second contact comprising a second reflecting metal layer on a second transparent conductive oxide layer, the second transparent conductive oxide layer having a second thickness, and the trench having at least one side wall and extending to an n-type current spreading layer on a substrate.

Embodiment (m): The LED device of embodiment (l), further comprising a nucleation layer on the substrate and a defect reduction layer on the nucleation layer.

Embodiment (n). The LED device of embodiments (l) to (m), wherein the first reflecting metal layer and second reflecting metal layer independently comprises one or more of silver (Ag), nickel (Ni), aluminium (Al), and titanium (Ti).

Embodiment (o). The LED device of embodiments (l) to (n), wherein the first transparent conductive oxide layer and the second transparent conductive oxide layer independently comprise one or more of indium tin oxide (ITO), zinc oxide (ZnO), tin oxide (SnO), and indium zinc oxide (InZnO).

Embodiment (p). The LED device of embodiments (l) to (o), wherein the difference between the first thickness and the second thickness is in a range of from 40 nm to 60 nm.

Embodiment (q). The LED device of embodiments (l) to (p), wherein the electroluminescent quantum well emits a first light having a first wavelength and the photoluminescent quantum well absorbs at least a portion of the first light and emits a second light having a longer wavelength than the first light.

Embodiment (r). The LED device of embodiments (l) to (q), further comprising an n-type contact in the trench on the n-type current spreading layer.

Embodiment (s). The LED device of embodiments (l) to (r), further comprising a dichroic reflector on the substrate opposite the n-type current spreading layer.

Embodiment (t). A method of manufacturing an LED device, the method comprising: forming a nucleation layer on a substrate; forming a defect reduction layer on the nucleation layer; forming an n-type current spreading layer on the defect reduction layer; forming at least one photoluminescent quantum well on the n-type current spreading layer; forming an n-type layer on the at least one photoluminescent quantum well; forming at least one electroluminescent quantum well on the n-type layer; forming a p-type layer on the electroluminescent quantum well; etching to form a first mesa and a second mesa separated by a trench, the trench having at least one side wall and extending to the n-type current spreading layer; conformally depositing a dielectric layer on the first mesa and the second mesa; forming a contact hole in the first mesa and the second mesa; and forming a first contact on the first mesa and a second contact on the second mesa.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an LED device, the method comprising:
    forming a nucleation layer on a substrate;
    forming a defect reduction layer on the nucleation layer;
    forming an n-type current spreading layer on the defect reduction layer;
    forming at least one photoluminescent quantum well on the n-type current spreading layer;
    forming an n-type layer on the at least one photoluminescent quantum well;
    forming at least one electroluminescent quantum well on the n-type layer;
    forming a p-type layer on the electroluminescent quantum well;
    etching to form a first mesa and a second mesa separated by a trench, the trench having at least one side wall and extending to the n-type current spreading layer;
    conformally depositing a dielectric layer on the first mesa and the second mesa;
    forming a contact hole in the first mesa and the second mesa; and
    forming a first contact on the first mesa and a second contact on the second mesa.

2. The LED method of claim 1, wherein the first contact comprises a first reflecting metal layer on a first transparent conductive oxide layer.

3. The method of claim 2, wherein the reflecting metal layer comprises one or more of silver (Ag), nickel (Ni), aluminium (Al), and titanium (Ti).

4. The method of claim 2 wherein the first transparent conductive oxide layer comprises one or more of indium tin oxide (ITO), gallium oxide ($Ga_2O_3$), zinc oxide (ZnO), tin oxide ($SnO_2$), and indium zinc oxide (InZnO).

5. The method of claim 1, wherein the at least one electroluminescent quantum well emits a first light having a first wavelength and the at least one photoluminescent quantum well absorbs at least a portion of the first light and emits a second light having a longer wavelength than the first light.

6. The method of claim 5, wherein the electroluminescent quantum well comprises multiple quantum wells emitting a same wavelength of light.

7. The method of claim 5, wherein the photoluminescent quantum well comprises multiple quantum wells emitting a same wavelength of light.

8. The method of claim 1, further comprising forming an n-type contact in the trench on the n-type current spreading layer.

9. The method of claim 1, wherein the substrate is a transparent substrate.

10. The method of claim 9, further comprising forming a dichroic reflector on the substrate opposite the n-type current spreading layer.

11. A method of manufacturing an LED device, the method comprising:
    forming an n-type current spreading layer on a substrate;
    forming at least one photoluminescent quantum well on the n-type current spreading layer;
    forming an n-type layer on the at least one photoluminescent quantum well;
    forming at least one electroluminescent quantum well on the n-type layer;
    forming a p-type layer on the electroluminescent quantum well;
    etching to form a first mesa and a second mesa separated by a trench, the trench having at least one side wall and extending to the n-type current spreading layer;
    conformally depositing a dielectric layer on the first mesa and the second mesa;
    forming a contact hole in the first mesa and the second mesa; and
    forming a first contact on the first mesa and a second contact on the second mesa.

12. The LED method of claim 11, wherein the first contact comprises a first reflecting metal layer on a first transparent conductive oxide layer.

13. The method of claim 12, wherein the reflecting metal layer comprises one or more of silver (Ag), nickel (Ni), aluminium (Al), and titanium (Ti).

14. The method of claim 12, wherein the first transparent conductive oxide layer comprises one or more of indium tin oxide (ITO), gallium oxide ($Ga_2O_3$), zinc oxide (ZnO), tin oxide ($SnO_2$), and indium zinc oxide (InZnO).

15. The method of claim 11, wherein the at least one electroluminescent quantum well emits a first light having a first wavelength and the at least one photoluminescent quantum well absorbs at least a portion of the first light and emits a second light having a longer wavelength than the first light.

16. The method of claim 15, wherein the electroluminescent quantum well comprises multiple quantum wells emitting a same wavelength of light and the photoluminescent quantum well comprises multiple quantum wells emitting a same wavelength of light.

17. The method of claim 11, further comprising forming an n-type contact in the trench on the n-type current spreading layer.

18. The method of claim 11, wherein the substrate is a transparent substrate.

19. The method of claim 18, further forming comprising a dichroic reflector on the substrate opposite the n-type current spreading layer.

20. The method of claim 11, further comprising forming a nucleation layer on the substrate and a defect reduction layer on the nucleation layer.

* * * * *